(12) United States Patent
Chiang et al.

(10) Patent No.: US 9,029,223 B1
(45) Date of Patent: May 12, 2015

(54) MOS DEVICE WITH ISOLATED DRAIN AND METHOD FOR FABRICATING THE SAME

(71) Applicant: MediaTek Inc., Hsin-Chu (TW)

(72) Inventors: Puo-Yu Chiang, Su'ao Township, Yilan County (TW); Yan-Liang Ji, Hualien (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 14/582,608

(22) Filed: Dec. 24, 2014

Related U.S. Application Data

(62) Division of application No. 14/039,161, filed on Sep. 27, 2013.

(51) Int. Cl.
*H01L 21/336* (2006.01)
*H01L 29/66* (2006.01)
*H01L 21/266* (2006.01)
*H01L 29/06* (2006.01)

(52) U.S. Cl.
CPC ........ *H01L 29/66659* (2013.01); *H01L 21/266* (2013.01); *H01L 29/0653* (2013.01)

(58) Field of Classification Search
CPC ..................... H01L 27/2454; H01L 29/66742; H01L 29/732; H01L 29/7802; H01L 29/7788; H01L 29/7371; H01L 29/7827; H01L 29/78642; H01L 29/7926; H01L 29/8083; H01L 29/66712

USPC .......... 257/335, 341, 339, E29.118, E29.027, 257/E29.256, E21.418
See application file for complete search history.

(56) References Cited

U.S. PATENT DOCUMENTS

2008/0157197 A1* 7/2008 Hsieh et al. .................... 257/339
2010/0001783 A1* 1/2010 Ronsisvalle et al. .......... 327/438

* cited by examiner

*Primary Examiner* — Selim Ahmed
(74) *Attorney, Agent, or Firm* — McClure, Qualey & Rodack, LLP

(57) ABSTRACT

A method for fabricating a metal-oxide-semiconductor (MOS) device with isolated drain. The method performing operations of: forming a first well region embedded in a portion of a semiconductor substrate; forming a first patterned mask layer over the semiconductor substrate, exposing portions of the semiconductor substrate; performing a first ion implant process on the portions of the semiconductor substrate exposed by the first patterned mask layer; performing a second ion implant process to a second well region exposed, forming a fourth well region between the first well region and the second well region; performing a third implant process to the second well region, forming a fifth well region overlying the fourth well region; forming a source region in a portion of the third well region; and forming a drain region in a portion of the fifth well region.

10 Claims, 8 Drawing Sheets

MOS DEVICE WITH ISOLATED DRAIN AND METHOD FOR FABRICATING THE SAME

CROSS REFERENCE TO RELATED APPLICATIONS

This application is a Divisional of application Ser. No. 14/039,161, filed Sep. 27, 2013, the entirety of which is incorporated by reference herein by reference.

BACKGROUND OF THE INVENTION

1. Field of the Invention

The present invention relates to semiconductor devices, and in particular, to a metal-oxide-semiconductor (MOS) device with an isolated drain and a method for fabricating the same.

2. Description of the Related Art

Battery-operated electronic systems such as notebook personal computers, personal digital assistants, and wireless communication devices often use power MOS (metal oxide semiconductor) devices as low on-resistance electronic switches for distributing battery power. For battery-operated applications, low on-resistance can be particularly important to ensure as little power consumption on the battery as possible. This ensures long battery life.

FIG. 1 is an electrical schematic of a conventional buck converter for power management of an electronic system. During operation, when both a high-side MOS device 12 and a low-side MOS device 10 turn off, in order to keep the current in inductor 14 continuous, a body diode and a substrate diode (both not shown) in the low-side MOS device 10 will turn on to support this current. However, undesired substrate current injections happen due to the action of turning on the substrate diode in the low-side MOS device 10, such that noises for causing latch-up or other circuit function failures may thus affect the control circuitry 20 of the electronic system.

BRIEF SUMMARY OF THE INVENTION

Accordingly, a MOS device with an isolated drain and a method for fabricating the same are thus provided.

An exemplary MOS device with an isolated drain comprises: a semiconductor substrate having a first conductivity type; a first well region embedded in a first portion of the semiconductor substrate, having a second conductivity type opposite to the first conductivity type; a second well region disposed in a second portion of the semiconductor substrate, overlying the first well region and having the first conductivity type; a third well region disposed in a third portion of the semiconductor substrate, overlying the first well region and adjacent to the second well region, having the second conductivity type; a fourth well region disposed in a fourth portion of the semiconductor substrate between the first and third well regions, having the first conductivity type; a gate stack formed over the semiconductor substrate, covering a portion of the second and third well regions; a source region disposed in a portion of the second well region, having the second conductivity type; and a drain region disposed in a portion of the fourth well region, having the second conductivity type.

An exemplary method for fabricating a MOS device with an isolated drain comprises: providing a semiconductive substrate having a first conductivity type; forming a first well region embedded in a portion of the semiconductor substrate, having a second conductivity type opposite to the first conductivity type; forming a first patterned mask layer over the semiconductor substrate, exposing portions of the semiconductor substrate, wherein the portions of the semiconductor substrate are separated from each other by the first patterned mask layer; performing a first ion implant process on the portions of the semiconductor substrate exposed by the first patterned mask layer, forming a plurality of second well regions in the semiconductor substrate and defining a plurality of third well regions in the semiconductor substrate, wherein the second well regions and third well regions are interleaved and overlie the first well region, and the second well regions have the second conductivity type, and the third well regions have the first conductivity type; removing the first patterned mask layer and forming a second patterned mask layer over the semiconductor substrate, exposing one of the second well regions; performing a second ion implant process to the second well region exposed by the second patterned mask layer, forming a fourth well region between the first well region and the well region, wherein the fourth well region is adjacent to a side of the third well region and has the first conductivity type; performing a third implant process to the second well region exposed by the second patterned mask layer, forming a fifth well region overlying the third well region and being adjacent to the third well region, wherein the fifth well region has the second conductivity type; removing the second patterned mask layer and forming a gate stack over semiconductor substrate, covering a portion of the third and fifth well regions; forming a source region in a portion of the third well region; and forming a drain region in a portion of the fifth well region.

Another exemplary method for fabricating a metal-oxide-semiconductor (MOS) device with isolated drain comprises: providing a semiconductor substrate having a first conductivity type; forming a first well region embedded in a portion of the semiconductor substrate, having a second conductivity type opposite to the first conductivity type; forming a first patterned mask layer over the semiconductor substrate, exposing two portions of the semiconductor substrate, wherein the two portions of the semiconductor substrate are separated from each other by the first patterned mask layer; performing a first ion implant process on the two portions of the semiconductor substrate exposed by the first patterned mask layer, forming two second well regions in the semiconductor substrate and defining a third well region in the semiconductor substrate, wherein the second well regions are isolated from each other by the third well region and overlie the first well region, and the second well regions have the second conductivity type, and the third well region has the first conductivity type; removing the first patterned mask layer and forming a second patterned mask layer over the semiconductor substrate, exposing a portion of the third well region; performing a second ion implant process to the portion of the third well region exposed by the second patterned mask layer, forming a fourth well region between the first well region and the portion of the third well region exposed by the second patterned mask layer, wherein the fourth well region has the first conductivity type; performing a third implant process to the portion of the third well region exposed by the second patterned mask layer, forming a fifth well region overlying the fourth well region and being adjacent to other portions of the third well region covered by the second patterned mask layer, wherein the fifth well region has the second conductivity type; removing the second patterned mask layer and forming a gate stack over the semiconductor substrate, covering a portion of the third and fifth well regions; forming a source region in a portion of the third well region; and forming a drain region in a portion of the fifth well region.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

FIGS. 2-5 are schematic diagrams showing an exemplary method for fabricating a MOS device with an isolated drain. The exemplary method shown in FIGS. 2-5 is a comparative embodiment for describing a method for preventing substrate current injection issues of a low-side MOS device in the power management circuitry of an electronic system found by the inventors, but not to limit the scope of the present application.

Figure 2:
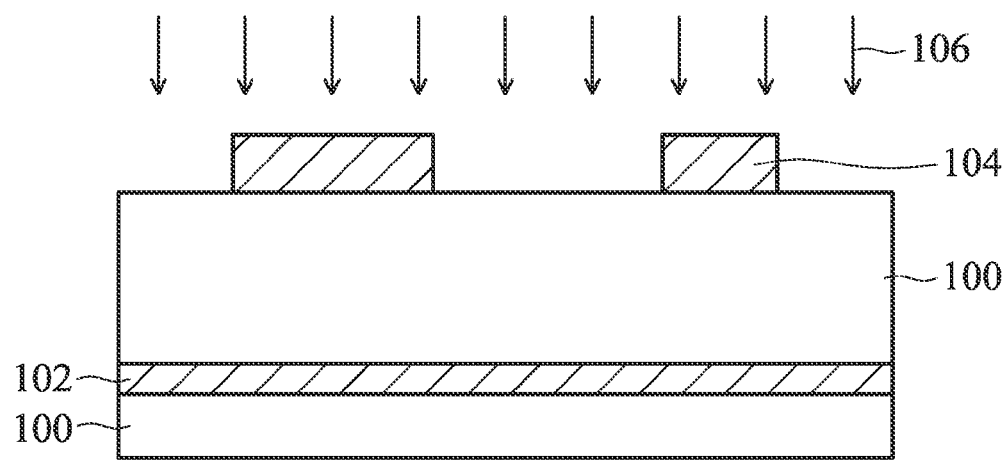
FIGS. 2-5 are schematic diagrams showing a method for fabricating a MOS device with an isolated drain according to an embodiment of the invention.

In FIG. 2, a semiconductor substrate 100 having a well region 102 embedded therein is provided. The semiconductor substrate 100 has a first conductivity type and can be, for example, a buck silicon substrate or a silicon layer over a substrate. The well region 102 can be, for example, a doping region having a second conductivity type opposite to the first conductivity type, and can be formed by, for example, ion implantation. In one embodiment, the semiconductor substrate 100 is a p-type silicon substrate and has a p-type dopant concentration of about $10^{14}$-$10^{16}$ atoms/cm$^3$, and the well region 102 is an n-type region and has an n-type dopant concentration of about $10^{17}$-$10^{18}$ atoms/cm$^3$.

Next, a patterned mask layer 104 is formed over the top surface of the semiconductor substrate 100, exposing portions of the top surface of the semiconductor substrate 100. The patterned mask layer 104 may comprise photoresist material and can be patterned by a photolithography method by using a photo mask (both not shown). An ion implant process 106 is then performed on the portions of the semiconductor substrate 100 exposed by the patterned mask layer 104, using the patterned mask layer 104 as an implant mask to implant dopants of the second conductivity type into the semiconductor substrate 100.

Figure 3:
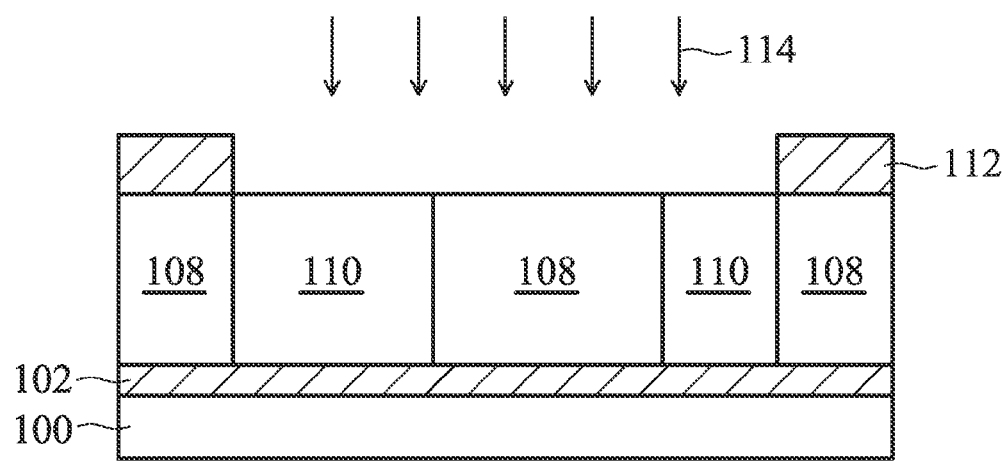

In FIG. 3, after the removal of the patterned mask layer 104, a plurality of well regions 108 of the second conductivity type are formed separately in various portions of the semiconductor substrate 100, and the well regions 108 overlie a portion of the well region 102. The well regions 108 are isolated from each other by a well region 110 therebetween, and the well region 110 is a part of the semiconductor substrate 100 which is not implanted in the ion implant process 106 (see FIG. 2) and has the first conductivity. In one embodiment, the well regions 108 are n-type regions and have a dopant concentration of about $10^{16}$-$10^{17}$ atoms/cm$^3$. Next, a patterned mask layer 112 is formed over the top surface of the semiconductor substrate 100 to expose the top surfaces of the well region 108 and two well regions 110 adjacent to the opposite side thereof. The patterned mask layer 112 may comprise photoresist material and can be patterned by a photolithography method by using a photo mask (both not shown). An ion implant process 114 is then performed on the well regions 108 and 110 exposed by the patterned mask layer 112, using the patterned mask layer 112 as an implant mask to implant dopants of the first conductivity type therein.

Figure 4:
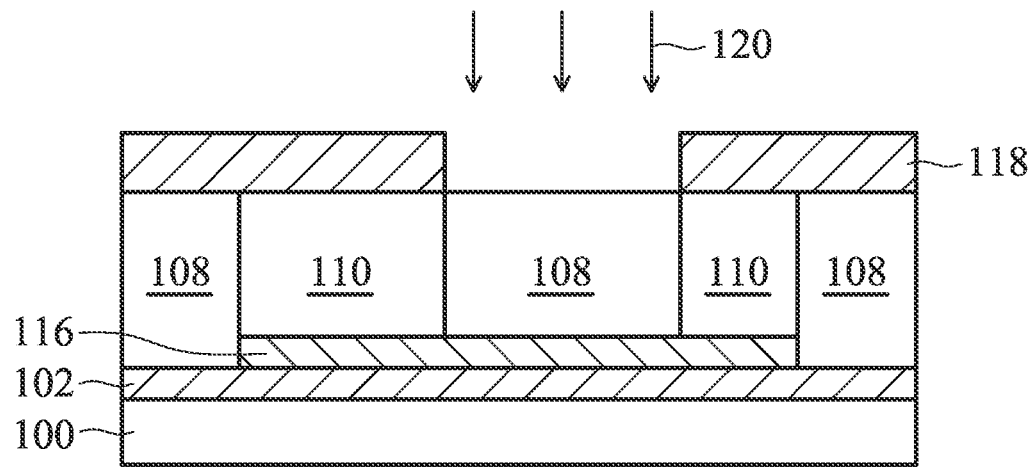

In FIG. 4, after removal of the patterned mask layer 112, a well region 116 of the first conductivity type is formed above the well region 102 and under the well regions 108 and 110 exposed by the patterned mask layer 112 (see FIG. 3). In one embodiment, the well region 116 is a p-type region and has an p-type dopant concentration of about $10^{16}$-$10^{17}$ atoms/cm$^3$. Next, a patterned mask layer 118 is formed over the top surface of the semiconductor substrate 100 to expose the well region 108 overlying the well region 116. The patterned mask layer 118 may comprise photoresist material and can be patterned by a photolithography method by using a photo mask (both not shown). An ion implant process 120 is then performed on the well region 108 exposed by the patterned mask layer 118, using the patterned mask layer 118 as an implant mask to implant dopants of the second conductivity type into the semiconductor substrate 100.

Figure 5:
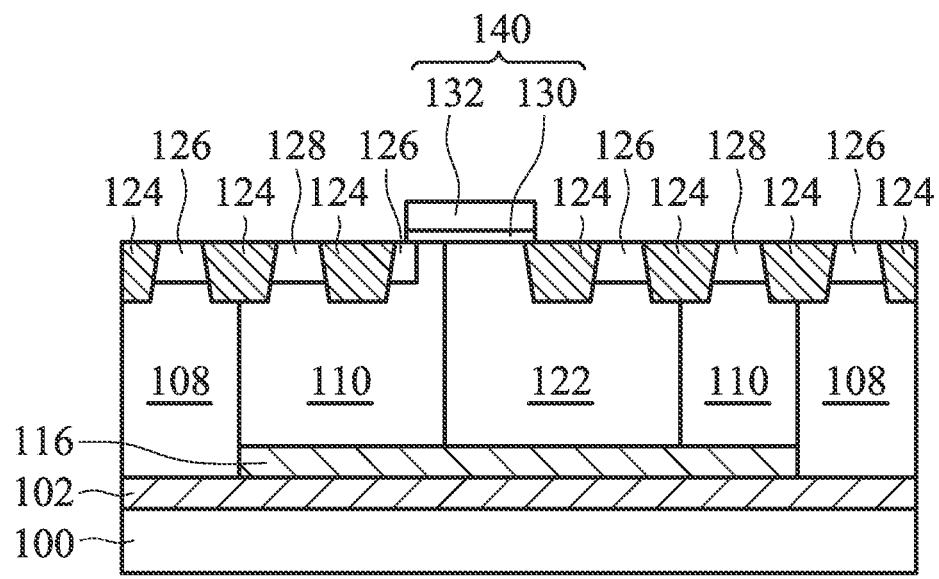

In FIG. 5, after removal of the patterned mask layer 122, a well region 122 of the second conductivity type forms and replaces the well region 108 exposed by the patterned mask layer 122 shown in FIG. 4. In one embodiment, the well region 122 is an n-type region and has an n-type dopant concentration of about $10^{16}$-$10^{17}$ atoms/cm$^3$. Next, a plurality of isolation structures 124 are formed in various portions of the well regions 108, 110, and 122, and a plurality of doping regions 126 and 128 are then formed in various portions of the well regions 108, 110, and 122, and a gate stack 140 is then formed over a portion of the well region 122 and a portion of the well region 110 adjacent thereto. The isolation structures 124 can be, for example, field oxides (FOX) or shallow trench isolations (STI), and can be formed by the known isolation fabrication techniques. The isolation structures 124 are illustrated as STI structures in FIG. 5, but are not limited thereto. The isolation structures 124 are formed in various portions of the well regions 108, 110, and 122, and thus define a plurality of regions for forming the doping regions 126 and 128. The doping regions 126 have the second conductivity type and function as contact regions for external circuits and as source/drain regions for a MOS device, and the doping regions 128 have the first conductivity type and functions as bulk contact regions for external circuits. In one embodiment, the doping regions 126 have an n-type dopant concentration of about $10^{19}$-$10^{20}$ atoms/cm$^3$, and the doping regions 128 have a p-type dopant concentration of about $10^{19}$-$10^{20}$ atoms/cm$^3$. The gate stack 140 extends over a portion of the well region 122 and the well region 110 adjacent thereto, and partially covers the doping region 126 in the well region 110 and the isolation structure 124 in the well region 122. The gate stack 140 may comprises a gate dielectric layer 130 and a gate electrode 132 formed over the gate dielectric layer 130. The gate stack 140 and the doping regions 126 and 128 can be formed by known techniques.

Figure 1:
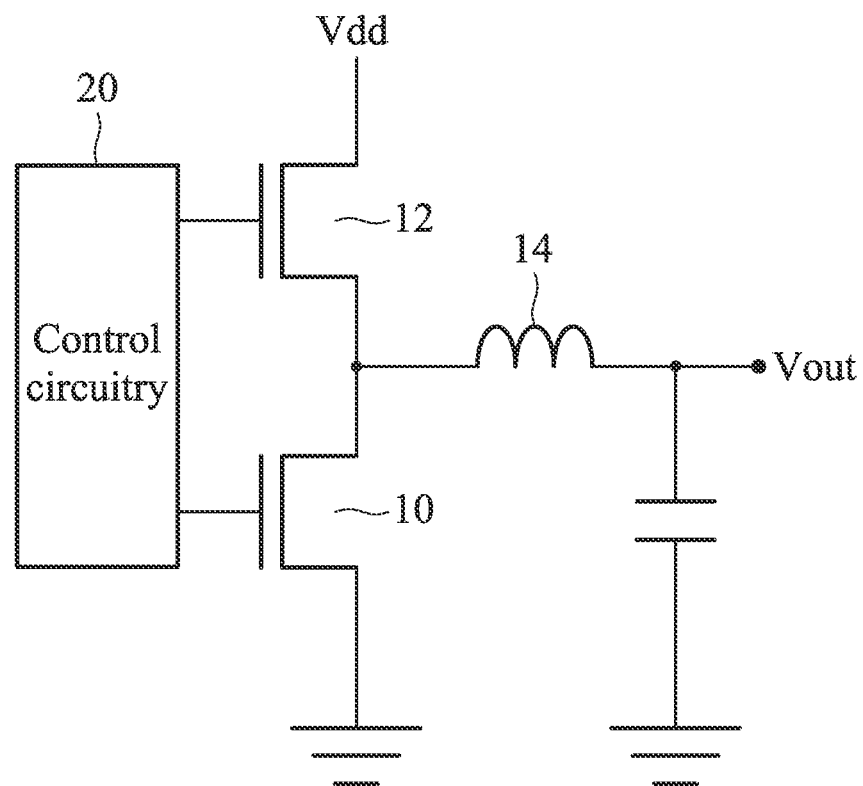
FIG. 1 is a schematic electrical diagram of a conventional buck converter for power management of an electronic system.

As shown in FIG. 5, a MOS device capable of functioning as the low-side MOS device 10 of the buck converter for power management of an electronic system shown in FIG. 1 is provided. In one embodiment, during operation, the doping region 126 in the well region 122 may function as a drain of the MOS device, and the well region 116 may function as a drain isolation structure for preventing the turning on of a substrate diode and causing undesired substrate current injection issues in the MOS device, such that noises for causing latch-up or other circuit function failures may thus be prevented from affecting the control circuitry 20 of the electronic system. Numbers and locations of the isolation structures 124, the doping regions 126 and 128 can be adjusted according to a design of the MOS device and is not limited to that shown in FIG. 5.

FIGS. 6-9 are schematic diagrams showing another exemplary method for fabricating a MOS device with an isolated drain. The exemplary method shown in FIGS. 6-9 is a more cost-effective method than the exemplary method disclosed in FIGS. 2-5.

Figure 6:
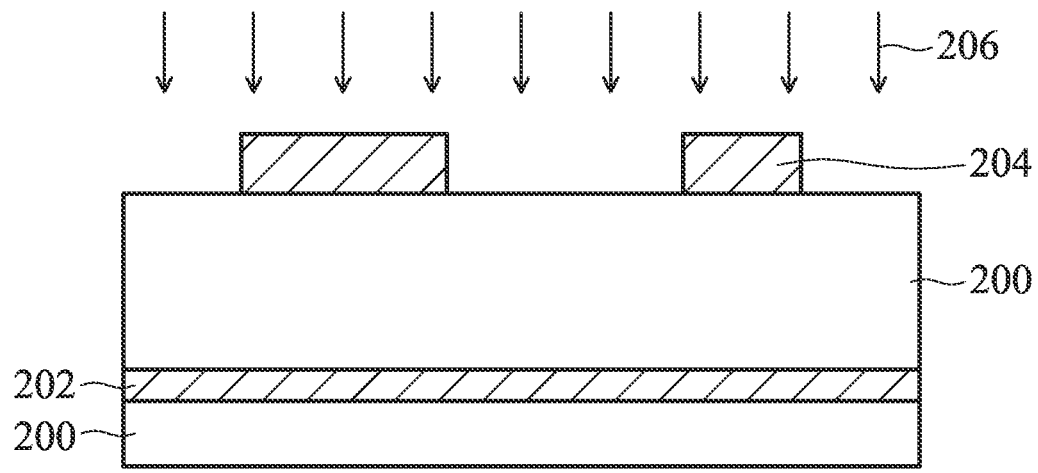
FIGS. 6-9 are schematic diagrams showing a method for fabricating a MOS device with an isolated drain according to another embodiment of the invention.

In FIG. 6, a semiconductor substrate 200 having a well region 202 embedded therein is provided. The semiconductor substrate 200 has a first conductivity type and can be, for example, a buck silicon substrate or a silicon layer over a substrate. The well region 202 can be, for example, a doping region having a second conductivity type opposite to the first conductivity type, and can be formed by ion implantation, for example. In one embodiment, the semiconductor substrate 200 is a p-type silicon substrate and has a p-type dopant concentration of about $10^{14}$-$10^{16}$ atoms/cm$^3$, and the well region 202 is an n-type region and has an n-type dopant concentration of about $10^{17}$-$10^{18}$ atoms/cm$^3$.

Next, a patterned mask layer 204 is formed over the top surface of the semiconductor substrate 200, exposing portions of the top surface of the semiconductor substrate 200. The patterned mask layer 204 may comprise photoresist material and can be patterned by a photolithography method by using a photo mask (both not shown). An ion implant process 206 is then performed on the portions of the semiconductor substrate 200 that are exposed by the patterned mask layer 204, using the patterned mask layer 204 as an implant mask to implant dopants of the second conductivity type into the semiconductor substrate 200.

Figure 7:
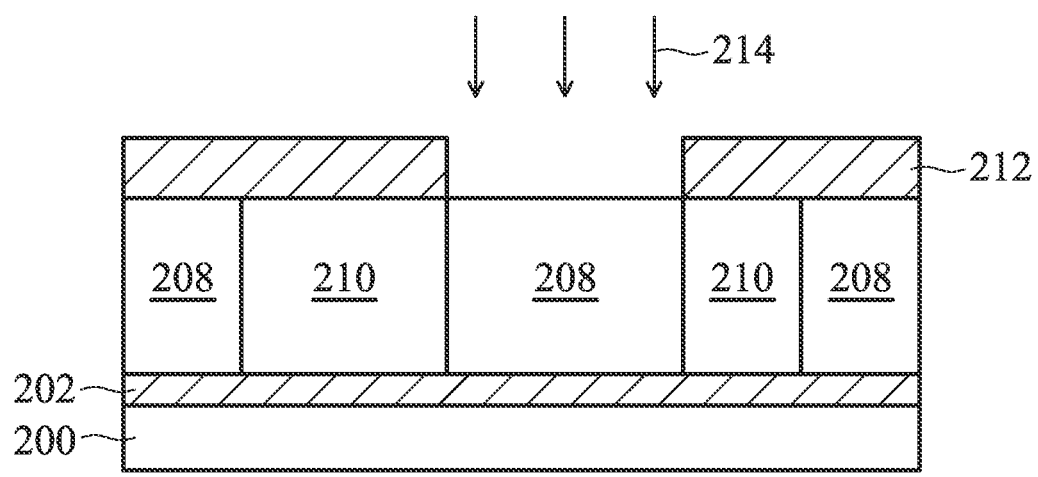

In FIG. 7, after removal of the patterned mask layer 204, a plurality of well regions 208 of the second conductivity type are formed separately in various portions of the semiconductor substrate 200, and the well regions 208 respectively overlies a portion of the well region 202. The well regions 208 are isolated from each other by a well region 210 therebetween, and the well region 210 is a part of the semiconductor substrate 200 which is not implanted in the ion implant process 206 (see FIG. 6) and has the first conductivity. In one embodiment, the well regions 208 are n-type regions and have a dopant concentration of about $10^{16}$-$10^{17}$ atoms/cm$^3$. Next, a patterned mask layer 212 is formed over the top surface of the semiconductor substrate 200 to expose top surfaces of the well region 208 and two well regions 210 adjacent to opposite side of the well region 208. The patterned mask layer 212 may comprise photoresist material and can be patterned by a photolithography method by using a photo mask (both not shown). An ion implant process 214 is then performed on the well region 208 exposed by the patterned mask layer 212, using the patterned mask layer 212 as an implant mask to implant dopants of the first conductivity type therein.

Figure 8:
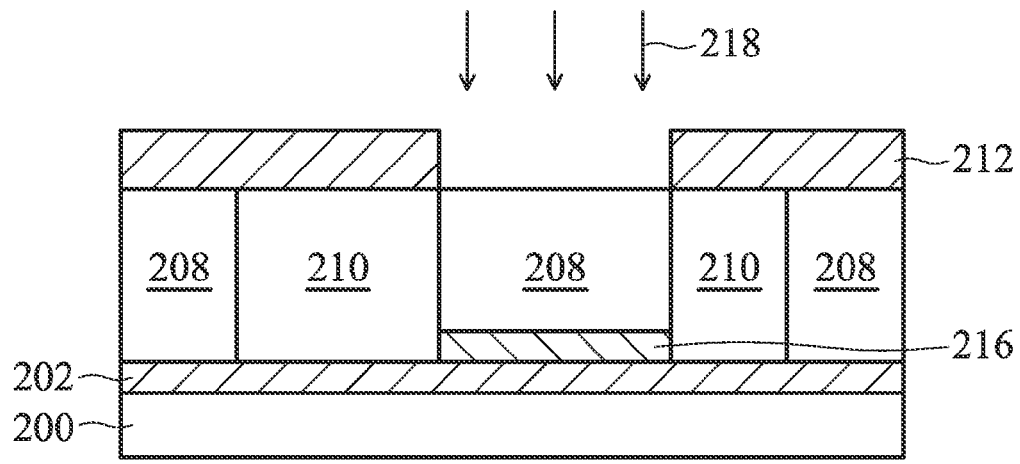

In FIG. 8, after the ion implant process 214, a well region 216 of the first conductivity type is formed above the well region 202 and under the well region 208 exposed by the patterned mask layer 212. In one embodiment, the well region 216 is a p-type region and has a p-type dopant concentration of about $10^{16}$-$10^{17}$ atoms/cm$^3$. Next, another ion implant process 218 is then performed on the well region 208 exposed by the patterned mask layer 212, using the patterned mask layer 212 as an implant mask to implant dopants of the second conductivity type into the well region 208.

Figure 9:
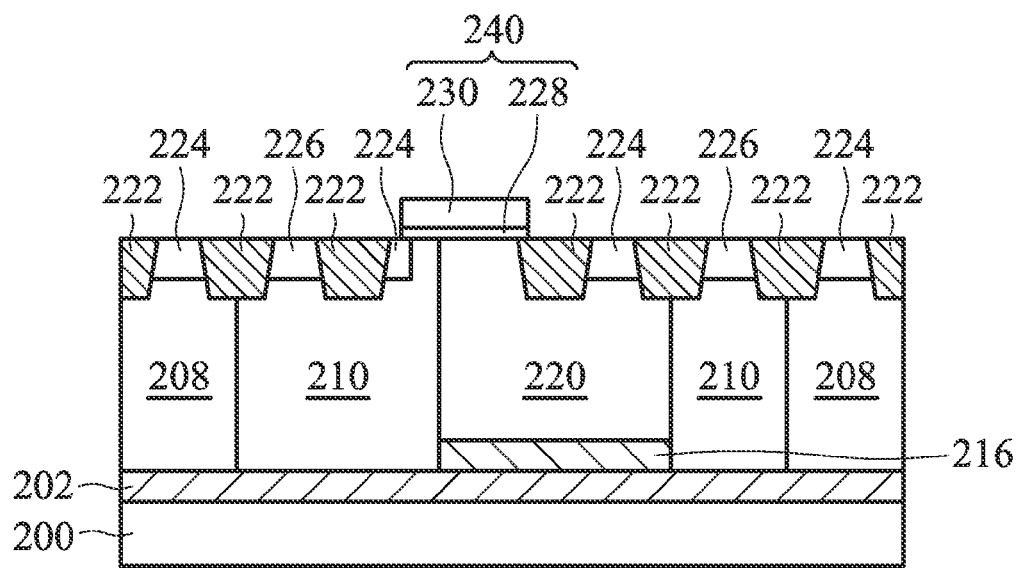

In FIG. 9, after removal of the patterned mask layer 212, a well region 220 of the second conductivity type forms and replaces the well region 208 shown in FIG. 8. In one embodiment, the well region 220 is an n-type region and has an n-type dopant concentration of about $10^{16}$-$10^{17}$ atoms/cm$^3$. Next, a plurality of isolation structures 222 are formed in various portions of the well regions 208, 210, and 220, and a plurality of doping regions 224 and 226 are then formed in various portions of the well regions 208, 210, and 220, and a gate stack 240 is then formed over a portion of the well region 220 and a portion of the well region 210 adjacent thereto. The isolation structures 222 can be, for example, field oxides (FOX) or shallow trench isolations (STI), and can be formed by the known isolation fabrication techniques. The isolation structures 222 are illustrated as STI structures in FIG. 9, but are not limited thereto. The isolation structures 222 are formed in various portions of the well regions 208, 210, and 220, and thus define a plurality of regions for forming the doping regions 224 and 226. The doping regions 224 have the second conductivity type and function as contact regions for external circuits and source/drain regions for a MOS device, and the doping regions 226 have the first conductivity type and function as bulk contact regions for external circuits. In one embodiment, the doping regions 224 have an n-type dopant concentration of about $10^{19}$-$10^{20}$ atoms/cm$^3$, and the doping regions 226 have a p-type dopant concentration of about $10^{19}$-$10^{20}$ atoms/cm$^3$. The gate stack 240 extends over a portion of the well region 220 and the well region 210 adjacent thereto, and partially covers the doping region 224 in the well region 210 and the isolation structure 222 in the well region 220. The gate stack 240 may comprise a gate dielectric layer 228 and a gate electrode 230 formed over the gate dielectric layer 228. The gate stack 240 and the doping regions 224 and 226 can be formed by known techniques.

As shown in FIG. 9, another MOS device capable of functioning as the low-side MOS device 10 of the buck converter for power management of an electronic system shown in FIG. 1 is provided. In one embodiment, during operation, the doping region 224 in the well region 220 may function as a drain of the MOS device, and the well region 216 may function as a drain isolation structure for preventing the turning on of a substrate diode and causing undesired substrate current injection issues in the MOS device, such that noises for causing latch-up or other circuit function failures may thus be prevented from affecting the control circuitry 20 of the electronic system. Numbers and locations of the isolation structures 222, the doping regions 224 and 226 can be adjusted according to a design of the MOS device and is not limited to that shown in FIG. 9.

The exemplary method shown in FIGS. 6-9 provides a more cost effective method for forming a MOS device for solving the substrate current injection issues than the exemplary method disclosed in FIGS. 2-5 since the well region 216 for preventing the substrate current injection issues is simultaneously formed by using the same patterned mask layer 212 for forming the well region 220, such that uses of at least one photolithography process and one photo mask can be reduced in the exemplary method shown in FIGS. 6-9, and the cost and time required for fabricating a MOS device with a isolated drain can be reduced.

The MOS devices shown in FIGS. 5 and 9 are both MOS devices applicable in a higher drain voltage greater than, for example, about 12V. The method for fabricating a MOS device shown in FIGS. 5-9 can be also used as forming a MOS device with an isolated drain applicable in a drain voltage of, for example, about 5-12V.

FIGS. 10-13 are schematic diagrams showing yet another exemplary method for fabricating the MOS device with an isolated drain shown in FIG. 9. The exemplary method shown in FIGS. 10-13 is modified from the method disclosed in FIGS. 6-9 and is also a more cost-effective method than the exemplary method disclosed in FIGS. 2-5. In the exemplary method disclosed in FIGS. 10-13, the same numbers represent the same elements disclosed in the exemplary method in FIGS. 6-9.

Figure 10:
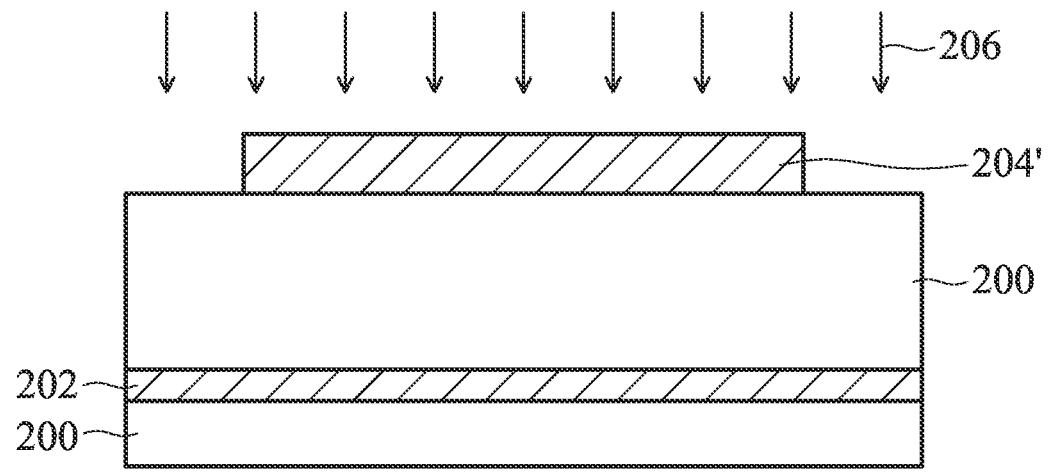
FIGS. 10-13 are schematic diagrams showing a method for fabricating a MOS device with an isolated drain according to yet another embodiment of the invention.

In FIG. 10, a semiconductor substrate 200 having a well region 202 embedded therein is provided. The semiconductor substrate 200 has a first conductivity type and can be, for example, a buck silicon substrate or a silicon layer over a substrate. The well region 202 can be, for example, a doping region having a second conductivity type opposite to the first conductivity type, and can be formed by ion implantation, for example. In one embodiment, the semiconductor substrate 200 is a p-type silicon substrate and has a p-type dopant concentration of about $10^{14}$-$10^{16}$ atoms/cm$^3$, and the well region 202 is an n-type region and has an n-type dopant concentration of about $10^{17}$-$10^{18}$ atoms/cm$^3$.

Next, a patterned mask layer 204' different from the patterned mask layer 204 shown in FIG. 6 is formed over only a portion of the top surface of the semiconductor substrate 200, thereby exposing two portions of the top surface of the semiconductor substrate 200 separated by the patterned mask layer 204'. The patterned mask layer 204' may comprise photoresist material and can be patterned by a photolithography method by using a photo mask (both not shown). An ion implant process 206 is then performed on the portions of the semiconductor substrate 200 that are exposed by the patterned mask layer 204', using the patterned mask layer 204' as an implant mask to implant dopants of the second conductivity type into the semiconductor substrate 200.

Figure 11:
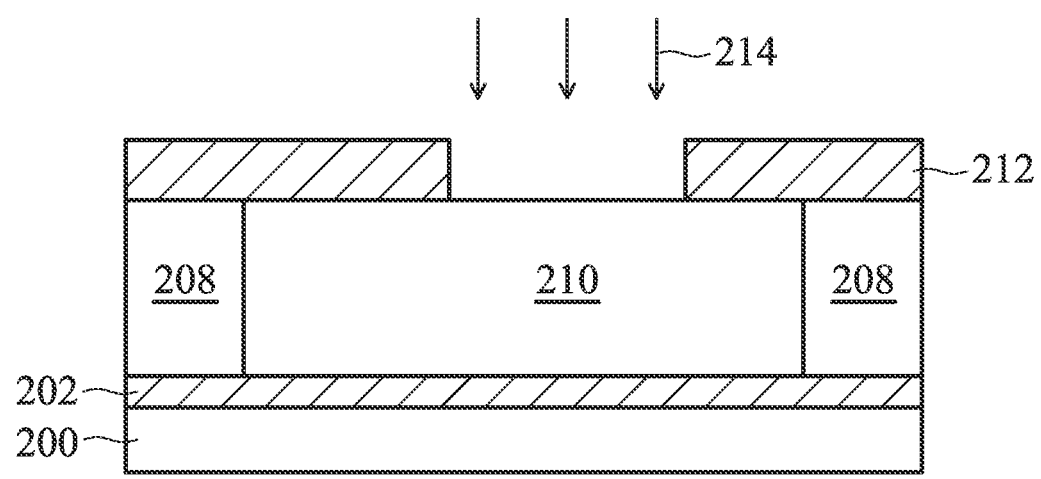

In FIG. 11, after removal of the patterned mask layer 204', two well regions 208 of the second conductivity type are formed separately in two portions of the semiconductor substrate 200, and the well regions 208 respectively overlies a portion of the well region 202. The well regions 208 are isolated from each other by a well region 210 therebetween, and the well region 210 is a part of the semiconductor substrate 200 which is not implanted in the ion implant process 206 (see FIG. 10) and has the first conductivity. In one embodiment, the well regions 208 are n-type regions and have a dopant concentration of about $10^{16}$-$10^{17}$ atoms/cm$^3$. Next, a patterned mask layer 212 the same as that shown in FIG. 7 is formed over the top surface of the semiconductor substrate 300 to expose a portion of the top surface of the well region 210 between the two well regions 208. The patterned mask layer 212 may comprise photoresist material and can be patterned by a photolithography method by using a photo mask (both not shown). An ion implant process 214 is then performed on the well region 210 exposed by the patterned mask layer 212, using the patterned mask layer 212 as an implant mask to implant dopants of the first conductivity type therein.

Figure 12:
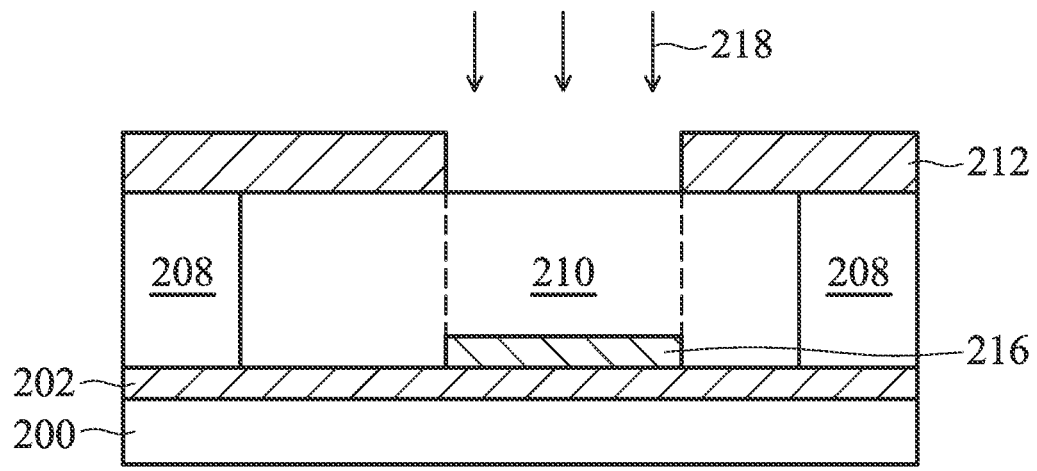

In FIG. 12, after the ion implant process 214, a well region 216 of the first conductivity type is formed above the well region 202 and under a portion of the well region 210 exposed by the patterned mask layer 212. In one embodiment, the well region 216 is a p-type region and has a p-type dopant concentration of about $10^{16}$-$10^{17}$ atoms/cm$^3$. Next, another ion implant process 218 is then performed on the portion of well region 210 exposed by the patterned mask layer 212, using the patterned mask layer 212 as an implant mask to implant dopants of the second conductivity type into the portion of the well region 210 exposed by the patterned mask layer 212 (marked with dotted line).

Figure 13:
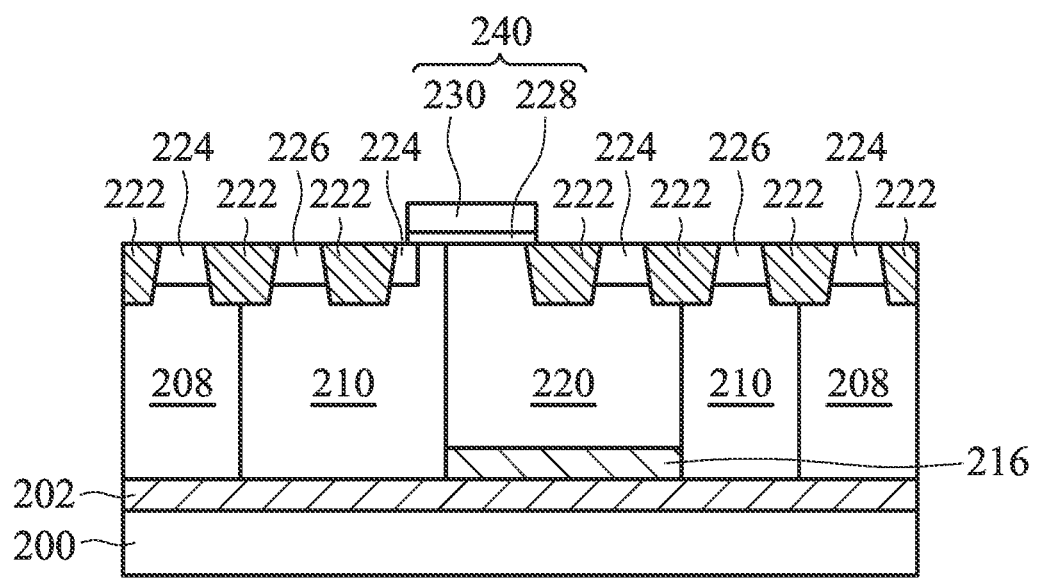

In FIG. 13, after removal of the patterned mask layer 212, a well region 220 of the second conductivity type is formed in a portion of the well region 210 and replaces the portion of the well region 210 exposed by the patterned mask layer 212 shown in FIG. 12. In one embodiment, the well region 220 is an n-type region and has an n-type dopant concentration of about $10^{16}$-$10^{17}$ atoms/cm$^3$. Next, a plurality of isolation structures 222 are formed in various portions of the well regions 208, 210, and 220, and a plurality of doping regions 224 and 226 are then formed in various portions of the well regions 208, 210, and 220, and a gate stack 240 is then formed over a portion of the well region 220 and a portion of the well region 210 adjacent thereto. The isolation structures 222 can be, for example, field oxides (FOX) or shallow trench isolations (STI), and can be formed by the known isolation fabrication techniques. The isolation structures 222 are illustrated as STI structures in FIG. 9, but are not limited thereto. The isolation structures 222 are formed in various portions of the well regions 208, 210, and 220, and thus define a plurality of regions for forming the doping regions 224 and 226. The doping regions 224 have the second conductivity type and function as contact regions for external circuits and source/drain regions for a MOS device, and the doping regions 226 have the first conductivity type and function as bulk contact regions for external circuits. In one embodiment, the doping regions 224 have an n-type dopant concentration of about $10^{19}$-$10^{20}$ atoms/cm$^3$, and the doping regions 226 have a p-type dopant concentration of about $10^{19}$-$10^{20}$ atoms/cm$^3$. The gate stack 240 extends over a portion of the well region 220 and the well region 210 adjacent thereto, and partially covers the doping region 224 in the well region 210 and the isolation structure 222 in the well region 220. The gate stack 240 may comprise a gate dielectric layer 228 and a gate electrode 230 formed over the gate dielectric layer 228. The gate stack 240 and the doping regions 224 and 226 can be formed by known techniques.

As shown in FIG. 13, a MOS device the same as that shown in FIG. 9 and capable of functioning as the low-side MOS device 10 of the buck converter for power management of an electronic system shown in FIG. 1 is provided. In one embodiment, during operation, the doping region 224 in the well region 220 may function as a drain of the MOS device, and the well region 216 may function as a drain isolation structure for preventing the turning on of a substrate diode and causing undesired substrate current injection issues in the MOS device, such that noises for causing latch-up or other circuit function failures may thus be prevented from affecting the control circuitry 20 of the electronic system. Numbers and locations of the isolation structures 222, the doping regions 224 and 226 can be adjusted according to a design of the MOS device and is not limited to that shown in FIG. 13.

Figure 14:
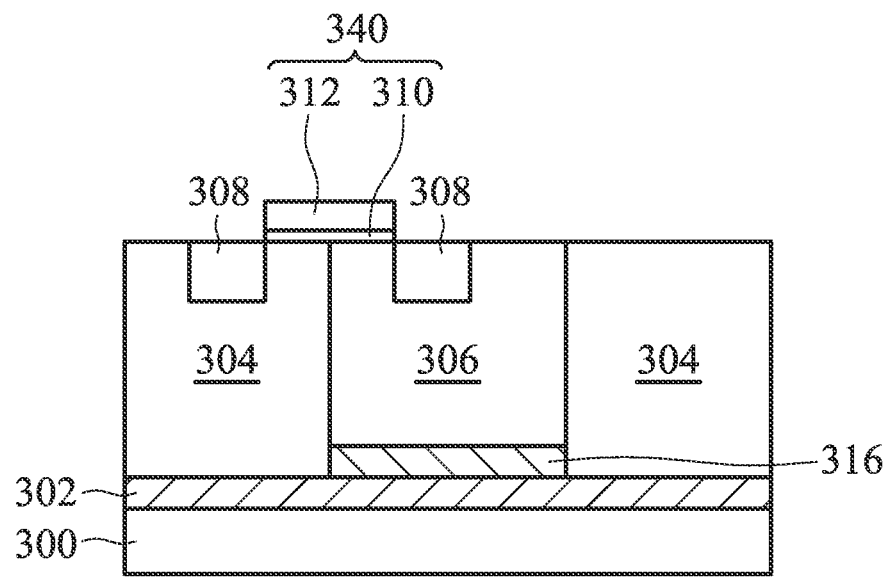
FIG. 14 is a schematic diagram showing a MOS device with an isolated drain according to an embodiment of the invention.
Figure 15:
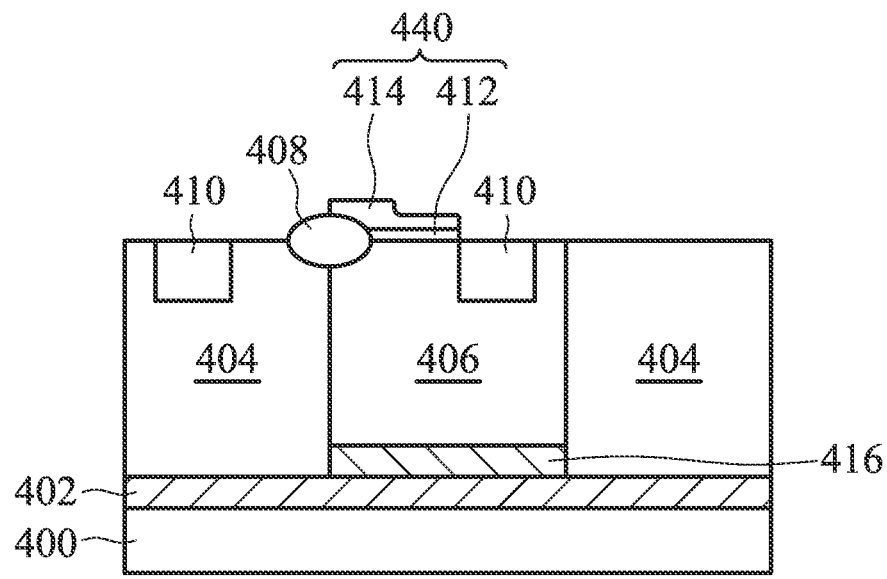
FIG. 15 is a schematic diagram showing a MOS device with an isolated drain according to another embodiment of the invention.

FIGS. 14 and 15 are schematic diagrams of other exemplary MOS devices with an isolated drain that may be modified from that shown in FIGS. 9 and 13. The MOS devices shown in FIGS. 14 and 15 can be formed by the method disclosed in FIGS. 6-9 and 10-13 by adjusting numbers or/and locations of the doping regions, well regions, gate stack, and isolation structures therein and are not described here again, for simplicity.

As shown in FIG. 14, the MOS device comprises a semiconductor substrate 300 having a first conductivity type such as p-type, a well region 302 embedded in a portion of the semiconductor substrate 300, having a second conductivity type opposite to the first conductivity type such as n-type; a plurality of well regions 304 disposed in various portions of the semiconductor substrate 300, overlying the well region 302 and having the first conductivity type; a well region 306 disposed in a portion of the semiconductor substrate 300, overlying the well region 302 and being adjacent to the well regions 304, having the second conductivity type; a well region 316 disposed in a portion of the semiconductor substrate 300 between the well region 306 and the well region 302, having the first conductivity type; a gate stack 340 formed over the semiconductor substrate, covering a portion of the well region 304 and the well region 306; a doping region 308 as a source region disposed in a portion of the well region 304, having the second conductivity type; and a doping region 308 as a drain disposed in a portion of the well region 306, having the second conductivity type. The gate stack 340 comprises a gate dielectric layer 310 and a gate electrode layer 312.

As shown in FIG. 15, another exemplary MOS device comprises a semiconductor substrate 400 having a first conductivity type such as p-type, a well region 402 embedded in a portion of the semiconductor substrate 400, having a second conductivity type opposite to the first conductivity type such as n-type; a plurality of well regions 304 disposed in various portions of the semiconductor substrate 400, overlying the well region 402 and having the first conductivity type; a well region 406 disposed in a portion of the semiconductor substrate 400, overlying the well region 402 and being adjacent to the well regions 404, having the second conductivity type; a well region 416 disposed in a portion of the semiconductor substrate 400 between the well region 406 and the well region 402, having the first conductivity type; an isolation structure 408 formed in a portion of the well regions 404 and 406; a gate stack 440 formed over semiconductor substrate 300, covering a portion of the well region 406 and the isolation structure 408; a doping region 410 as a source region disposed in a portion of the well region 404, having the second conductivity type; and a doping region 410 as a drain region disposed in a portion of the well region 406, having the second conductivity type. The gate stack 440 comprises a gate dielectric layer 410 and a gate electrode layer 412 partially overlying the isolation structure 408, and the isolation structure can be, for example, a field oxide as shown in FIG. 15.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a metal-oxide-semiconductor (MOS) device with isolated drain, comprising:
    providing a semiconductor substrate having a first conductivity type;
    forming a first well region embedded in a portion of the semiconductor substrate, having a second conductivity type opposite to the first conductivity type;
    forming a first patterned mask layer over the semiconductor substrate, exposing portions of the semiconductor substrate, wherein the portions of the semiconductor substrate are separated from each other by the first patterned mask layer;
    performing a first ion implant process on the portions of the semiconductor substrate exposed by the first patterned mask layer, forming a plurality of second well regions in the semiconductor substrate and defining a plurality of third well regions in the semiconductor substrate, wherein the second well regions and third well regions are interleaved and overlie the first well region, and the second well regions have the second conductivity type, and the third well regions have the first conductivity type;
    removing the first patterned mask layer and forming a second patterned mask layer over the semiconductor substrate, exposing one of the second well regions;
    performing a second ion implant process to the second well region exposed by the second patterned mask layer, forming a fourth well region between the first well region and the second well region, wherein the fourth well region is adjacent to a side of the third well region and has the first conductivity type;
    performing a third implant process to the second well region exposed by the second patterned mask layer, forming a fifth well region overlying the fourth well region and being adjacent to the third well region, wherein the fifth well region has the second conductivity type;
    removing the second patterned mask layer and forming a gate stack over the semiconductor substrate, covering a portion of the third and fifth well regions;
    forming a source region in a portion of the third well region; and
    forming a drain region in a portion of the fifth well region.

2. The method as claimed in claim 1, wherein the first conductivity type is p-type and the second conductivity type is n-type.

3. The method as claimed in claim 1 wherein the gate stack physically contacts the source and drain regions.

4. The method as claimed in claim 1, prior to the formation of the gate stack, further comprising forming an isolation structure disposed in a portion of the fifth well region, and the gate stack partially covers a portion of the isolation structure.

5. The method as claimed in claim 1, prior to the formation of the gate stack, further comprising forming an isolation structure disposed in a portion of the third and fifth regions, and the gate stack partially covers a portion of the isolation structure.

6. The method as claimed in claim 1, wherein the first well region comprises a dopant concentration of about $10^{17}$-$10^{18}$ atoms/cm$^3$.

7. The method as claimed in claim 1, wherein the second well regions comprise a dopant concentration of about $10^{16}$-$10^{17}$ atoms/cm$^3$.

8. The method as claimed in claim 1, wherein the fourth well region comprises a dopant concentration of about $10^{16}$-$10^{17}$ atoms/cm$^3$.

9. The method as claimed in claim 1, wherein the fifth well region comprises a dopant concentration of about $10^{16}$-$10^{17}$ atoms/cm$^3$.

10. The method as claimed in claim 1, wherein the source and drain regions comprise a dopant concentration of about $10^{19}$-$10^{20}$ atoms/cm$^3$.

* * * * *